United States Patent
Qu

(10) Patent No.: US 6,621,122 B2
(45) Date of Patent: Sep. 16, 2003

(54) TERMINATION STRUCTURE FOR SUPERJUNCTION DEVICE

(75) Inventor: Zhijun Qu, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/190,152

(22) Filed: Jul. 3, 2002

(65) Prior Publication Data
US 2003/0011046 A1 Jan. 16, 2003

Related U.S. Application Data
(60) Provisional application No. 60/303,724, filed on Jul. 6, 2001.

(51) Int. Cl.[7] ............................................. H01L 29/78
(52) U.S. Cl. .................. 257/339; 257/341; 257/490; 257/492; 257/494
(58) Field of Search ................................. 257/339, 341, 257/490, 492, 494

(56) References Cited

U.S. PATENT DOCUMENTS 6,441,455 B1 * 8/2002 Dutta .......................... 257/490
6,498,368 B2 * 12/2002 Sakamoto et al. ........... 257/341

* cited by examiner

Primary Examiner—Jerome Jackson
(74) Attorney, Agent, or Firm—Ostrolenk, Faber, Gerb & Soffen, LLP

(57) ABSTRACT

A termination structure for a superjunction device on which the net charge between P pylons in an N⁻ termination region is intentionally unbalanced and is negative. The P pylons in the termination area are further non-uniformly located relative to those in the active area. A field ring which is an extension of the source electrode terminates at a radial mid point of the termination region.

18 Claims, 1 Drawing Sheet

TERMINATION STRUCTURE FOR SUPERJUNCTION DEVICE

RELATED APPLICATION

This application claims the benefit of U.S. Provisional Application No. 60/303,724, filed Jul. 6, 2001.

FIELD OF THE INVENTION

This invention relates to semiconductor devices and more specifically relates to a termination structure for a superjunction type MOS-gated device.

BACKGROUND OF THE INVENTION

MOSgated superjunction devices are well known and employ, for example, for an N channel device, an active region consisting of a plurality of very deep parallel and spaced P type concentration columns (sometimes called pedestals or pylons), in an N type body of epitaxially deposited silicon. A conventional MOSgate structure permits or prevents current flow through a channel region at the top of each column to connect a top source contact to the N body or drift region. The total charges, as determined by the concentrations and dimensions of the P type columns and N type body are balanced, so that both deplete in the blocking condition. This permits the N concentration in the drift region which carries forward current during forward conduction to be increased above that of conventional MOS-gated devices, thus reducing on resistance.

The termination structure for such devices is commonly made of further P columns or pylons which extend out toward the edge or street of the die. These termination pylons underlie a conductive field plate atop a field oxide over the pylons, which field plate is an extension of the source contact.

It would be desirable to optimize the termination design to keep the electric field distribution constant in the termination region.

BRIEF DESCRIPTION OF THE INVENTION

In accordance with a first feature of the invention, the field plate edge which commonly extends over the outermost termination P columns (relative to the die center) is terminated at a position between the edge of the active region and the outer edge of the termination region. This is a desired position because the field plate is at the zero voltage potential of the source electrode.

In accordance with a second feature of the invention, the size and/or spacing (diameter, or total cross-sectional area) of the P pylons in the termination area is made larger than those in the active area. Thus, based on Gauss's Law, the net charge in the active area of a superjunction device must be balanced to achieve a flat electrical field distribution. However, in accordance with the invention, in the termination region the net P pylon charge is made negative at the full depletion condition. To apply this concept to the termination design, the P column size in the termination region may be made bigger than the P column size in the active area. For example the P column size in the termination is increased from 5 µm to 10 µm (mask size). Other techniques can be used.

In accordance with a third feature of the invention, the locations of the P columns in the termination area is non-uniform. Thus, when the P column area in the termination region increases, the electrical field in the termination can be effectively reduced. But this reduced electrical field will have some local distortion if the P columns are uniformly distributed. To smooth the field distortion, it is preferable to position the P columns in such a way as to maintain the net charge N(r) so that it satisfies the following equation:

$$N(r) \approx 1/r$$

By using these design concepts, the whole termination structure may be optimized.

DETAILED DESCRIPTION OF THE DRAWINGS

Figure 1:
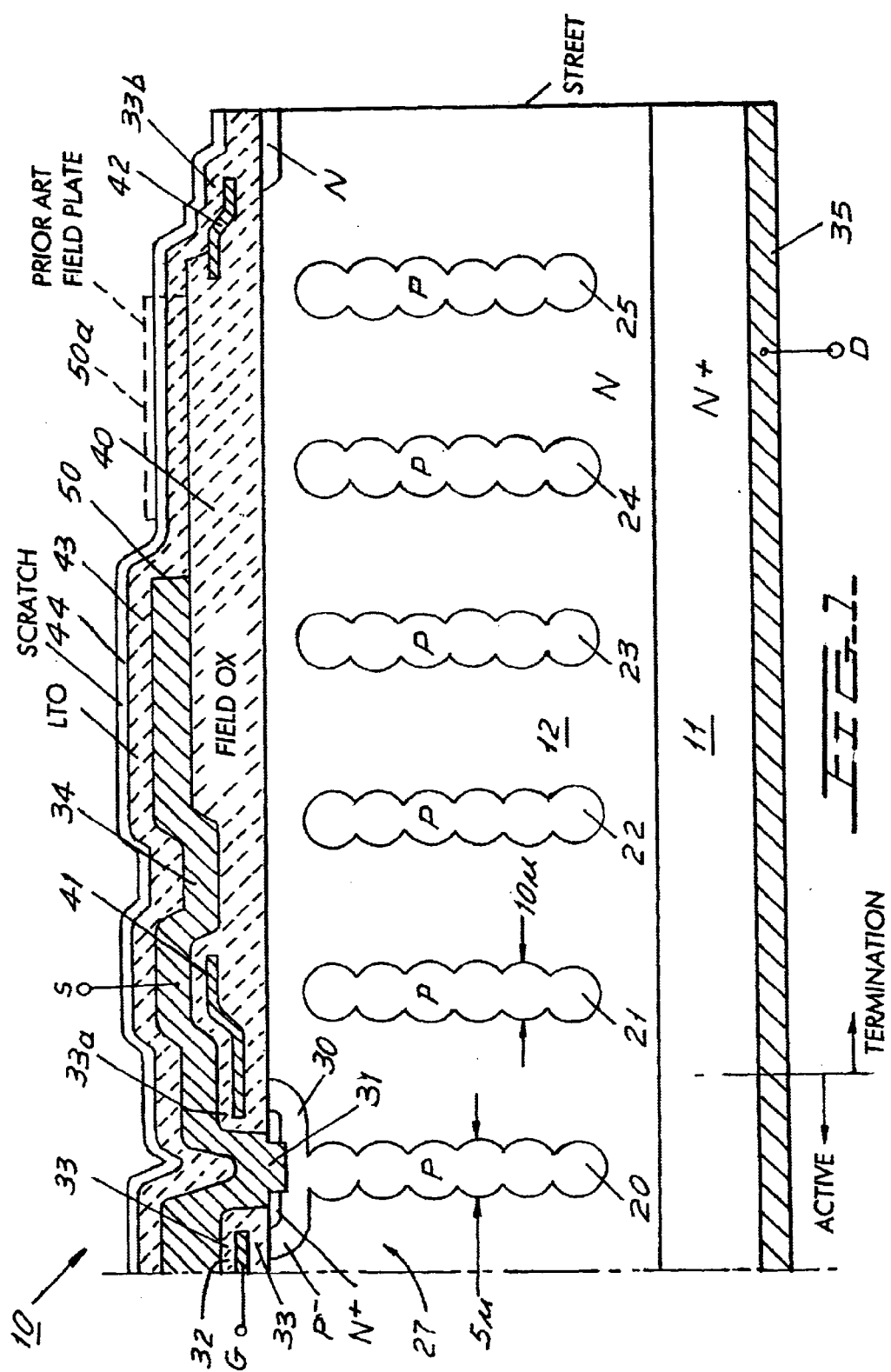
FIG. 1 is a cross-section of a small region of a superjunction die which incorporates features of the present invention.

Referring to FIG. 1, there is shown, in cross-section, a small portion of silicon die (sometimes referred to as a wafer or chip) 10 which consists of an N⁺ substrate 11 having an epitaxially deposited body layer 12 of N material. Layer 11 contains parallel and spaced P type columns or pylons or deep diffusions shown as pylons 20, 21, 22, 23, 24 and 25. Note that the conductivity types can be reversed as desired.

Columns 20 to 25 are formed in any desired manner and are shown as scalloped due to a particular process which may be used for their production in which thin epi layers are grown and then diffused with P type regions in a sequential manner to build the necessary P column height which is slightly less than the depth of the N drift region 27. Any other process can be used.

Pylon 20 is the last pylon of the die active region, it being understood that a large number of similar pylons are symmetrically distributed over the active region. The charges of these active P regions are balanced relative to that of the N drift region so that the net charge in both regions is balanced.

A MOSgate is provided for each of the pylons in the active region. Thus, a P channel diffusion 30 is formed atop and surrounds pylon 20 and an N⁺ source region 31 is formed in channel region 30. A gate oxide 33 is formed atop the inversion channel in channel region 30 and is covered by a conductive polysilicon gate 32. Gate 32 is, in turn, covered by an insulation LTO layer 33, and a conductive source electrode 34, usually of aluminum, contacts source 31 and channel region 30. A bottom drain electrode 35, usually a tri-metal, is connected to the bottom of the die 10.

In the active region described above, the P type pylons such as pylon 20 have a diameter of about 5 microns. The active area is then surrounded by a termination region which extends to the edge or "street" of the die. This termination has been filled with pylons of the same structure and spacing as those in the active region. In accordance with the invention, the termination region in FIG. 1 contains differently configured columns 21 to 24 as will be described.

The termination region contains a topmost thick field oxide 40 which has polysilicon field rings 41 and 42 at its inner and outer diameters, which are encapsulated by the LTO layers 33a and 33b. A low temperature oxide (LTO) insulation layer 43 also overlies source metal 34. A suitable scratch layer 44 overlies layer 43.

A number of improvements of the invention are incorporated into the structure of FIG. 1.

First, the field plate portion of the source electrode terminates at edge 50. In contrast, the field plate in the prior art extended as shown in dotted line 50a, to extend over the last pylon 25. It has been recognized, however, that since the field plate is at zero potential, it can end before the last P column at a point between columns 22 and 25.

In accordance with a second feature of the invention it is recognized that the net charge in the termination region should be negative at full depletion, and not balanced as in the active region. Accordingly, the diameter of the P columns 21 to 24 is made greater (about 10 microns) than that of the those in the active region (about 5 microns). Alternatively the pylons can be more closely spaced.

As a still further feature of the invention, the P columns in the termination region occupy different positions to reduce distortion in the termination electric field. Thus, to smooth distortion the P channel spacings are adjusted between columns 20, 21 (closely spaced) and columns 21, 22 (more greatly spaced). Other spacing changes may be made to maintain the net charge in the termination are so that N(r) is about equal to 1/r.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A termination for a superjunction MOSFET, said superjunction MOSFET comprising a silicon die having an active area and a termination area surrounding said active area; said active area comprising an $N^-$ depletion region and a plurality of spaced identical P type pylons of a first diameter extending into said $N^-$ depletion area; the total charge of said p type pylons being essentially equal to that of said $N^-$ depletion region so that both are depleted when blocking voltage is applied to said device; a MOSgate structure formed atop each of said pylons; said termination area comprising a plurality of spaced parallel P type pylons extending through a continuation of said $N^-$ depletion region; the total charge balance between said pylons in said termination area and said continuation of said $N^-$ depletion region being negative.

2. The MOSFET of claim 1, wherein said pylons in said termination area have a greater diameter than those in said active area.

3. The MOSFET of claim 2, wherein the said pylons in said active area have a diameter of about 5 $\mu$m and said pylons in said termination area have a diameter of about 10 $\mu$m.

4. The MOSFET of claim 1, wherein the spacing between the adjacent pylons of said active area and of said termination area is less than the spacing between said pylons in said active area to unbalance the charge distribution and to improve electric field distribution in the termination region.

5. The MOSFET of claim 2, wherein the spacing between the adjacent pylons of said active area and of said termination area is less than the spacing between said pylons in said active area to unbalance the charge distribution and to improve electric field distribution in the termination region.

6. The MOSFET of claim 3, wherein the spacing between the adjacent pylons of said active area and of said termination area is less than the spacing between said pylons in said active area to unbalance the charge distribution and to improve electric field distribution in the termination region.

7. The MOSFET of claim 1, which further includes a field plate for said termination area; said field plate being disposed atop and insulated from the pylons in said termination region which are immediately adjacent to said active area; said field plate extending to an intermediate area of said termination region such that pylons in an outer area of said termination region are not covered by said field plate.

8. The MOSFET of claim 7, which further includes a conductive source electrode for said MOSgated structure; said field plate comprising an extension of said source electrode.

9. The MOSFET of claim 2, which further includes first and second field plates for said termination area; said first field plate being disposed atop and insulated from the pylons in said termination region which are immediately adjacent to said active area; said second field plate terminating at a line which is radially intermediate to the area of said termination region.

10. The MOSFET of claim 3, which further includes first and second field plates for said termination area; said first field plate being disposed atop and insulated from the pylons in said termination region which are immediately adjacent to said active area; said second field plate terminating at a line which is radially intermediate to the area of said termination region.

11. The MOSFET of claim 9, which further includes a conductive source electrode for said MOSgated structure; said second field plate comprising an extension of source electrode.

12. The MOSFET of claim 10, which further includes a conductive source electrode for said MOSgated structure; said second field plate comprising an extension of source electrode.

13. The MOSFET of claim 7, wherein the spacing between the adjacent pylons of said active area and of said termination area is less than the spacing between said pylons in said active area to unbalance the charge distribution and to improve electric field distribution in the termination region.

14. The MOSFET of claim 8, wherein the spacing between the adjacent pylons of said active area and of said termination area is less than the spacing between said pylons in said active area to unbalance the charge distribution and to improve electric field distribution in the termination region.

15. The MOSFET of claim 9, wherein the spacing between the adjacent pylons of said active area and of said termination area is less than the spacing between said pylons in said active area to unbalance the charge distribution and to improve electric field distribution in the termination region.

16. The MOSFET of claim 10, wherein the spacing between the adjacent pylons of said active area and of said termination area is less than the spacing between said pylons in said active area to unbalance the charge distribution and to improve electric field distribution in the termination region.

17. A termination for a superjunction MOSFET, said superjunction MOSFET comprising a silicon die having an active area and a termination area surrounding said active area; said active area comprising an $N^-$ depletion region and a plurality of spaced identical P type pylons of a first diameter extending into said $N^-$ depletion area; the total charge of said p type pylons being essentially equal to that of said $N^-$ depletion region so that both are depleted when blocking voltage is applied to said device; a MOSgate structure formed atop each of said pylons; said termination area comprising a plurality of spaced parallel P type pylons extending through a continuation of said $N^-$ depletion region and a field plate for said termination area; said field plate being disposed atop and insulated from the pylons in said termination region which are immediately adjacent to said active area; said field plate terminating at an intermediate area of said termination region such that pylons in an outer area of said termination region are not covered by said field plate.

18. The MOSFET of claim 17, which further includes a conductive source electrode for said MOSgated structure; said field plate comprising an extension of said source electrode.

* * * * *